United States Patent
Chong et al.

(10) Patent No.: US 7,413,961 B2
(45) Date of Patent: Aug. 19, 2008

(54) METHOD OF FABRICATING A TRANSISTOR STRUCTURE

(75) Inventors: Yung Fu Chong, Singapore (SG); Kevin K. Dezfulian, Mount Kisco, NY (US); Zhijiong Luo, Carmel, NY (US); Huilong Zhu, Poughkeepsie, NY (US)

(73) Assignees: Chartered Semiconductor Manufacturing Ltd., Singapore (SG); International Business Machines Corporation, Armonk, NY (US)

( * ) Notice: Subject to any disclaimer, the term of this patent is extended or adjusted under 35 U.S.C. 154(b) by 112 days.

(21) Appl. No.: 11/383,952

(22) Filed: May 17, 2006

(65) Prior Publication Data

US 2007/0269952 A1    Nov. 22, 2007

(51) Int. Cl.
*H01L 21/76* (2006.01)

(52) U.S. Cl. .................. 438/430; 438/300; 438/589; 438/700; 257/E21.308; 257/E21.431

(58) Field of Classification Search .............. 438/159, 438/161, 280, 290; 257/E21.051, E21.308
See application file for complete search history.

(56) References Cited

U.S. PATENT DOCUMENTS

| 6,797,556 B2 * | 9/2004 | Murthy et al. ............... 438/231 |
| 6,867,428 B1 | 3/2005 | Besser et al. |
| 6,881,635 B1 * | 4/2005 | Chidambarrao et al. ..... 438/300 |

* cited by examiner

*Primary Examiner*—Scott B. Geyer
*Assistant Examiner*—Cheung Lee

(57) ABSTRACT

The present invention relates to semiconductor integrated circuits. More particularly, but not exclusively, the invention relates to strained channel complimentary metal oxide semiconductor (CMOS) transistor structures and fabrication methods thereof. There is provided a method of forming a strained channel transistor structure on a substrate, comprising the steps of: forming a source stressor recess comprising a deep source recess and a source extension recess; forming a drain stressor recess comprising a deep drain recess and a drain extension recess; and subsequently forming a source stressor in said source stressor recess and a drain stressor in said drain stressor recess. The deep source/drain and source/drain extension stressors are formed by an uninterrupted etch process and an uninterrupted epitaxy process.

22 Claims, 6 Drawing Sheets

METHOD OF FABRICATING A TRANSISTOR STRUCTURE

CROSS-REFERENCE TO RELATED APPLICATION(S)

The present application contains subject matter related to a concurrently filed U.S. Patent Application by Yung Fu Chong, et al. entitled "A STRAINED CHANNEL TRANSISTOR AND METHOD OF FABRICATION THEREOF". The related application is assigned to Chartered Semiconductor Manufacturing Ltd. and International Business Machines Corporation and is identified by docket number ICIS-0230.

1. Field of the Invention

The present invention relates to semiconductor integrated circuits. More particularly, but not exclusively, the invention relates to strained channel complimentary metal oxide semiconductor (CMOS) transistor structures and fabrication methods thereof.

2. Description of the Related Art

Integrated circuits comprising many thousands of semiconductor devices play an important role in a number of technology areas. The continued development of devices with higher performance at reasonable cost is important to the future development of many of these technologies. Metal oxide semiconductor field effect transistors (MOSFETs) are commonly used in semiconductor integrated circuits. It has been shown that the performance of a MOSFET device may be enhanced by the application of mechanical stresses to portions of the device.

A known MOSFET 10 is shown schematically in FIG. 1 (PRIOR ART). A MOSFET 10 is typically fabricated on a semiconductor substrate 12 such as silicon and has a source region 15 (also known as a 'deep' source region) and a drain region 16 (also known as a 'deep' drain region) separated by a conduction channel 17.

A gate stack 18 is provided over the conduction channel 17 (hereinafter referred to as the 'channel'). The gate stack 18 is formed from a gate dielectric layer 19 above the channel 17, and a gate electrode 20 above the gate dielectric layer 19. The application of a potential to the gate electrode 20 allows a flow of current through the channel 17 between the source 15 and the drain 16 to be controlled.

The gate stack 18 is provided with spacer elements 21, 22 on a source side and a drain side, respectively, of the gate stack 18. The purpose of the spacer elements 21, 22 is to define boundaries of the source and drain regions 15, 16 with respect to the channel 17. For example, the source and drain regions 15, 16 may be made by implantation of the substrate 12 with dopant.

The spacer elements 21, 22 may serve as an implantation mask during formation of the source and drain regions 15, 16 to define the boundary between the source and drain regions 15, 16 and the channel 17. Alternatively, the source and drain regions 15, 16 may be made by etching a source recess and a drain recess, and filling the recesses with in-situ doped silicon. In this case, the spacer elements 21, 22 serve to protect the underlying substrate from the effects of the etching process.

The source 15 and drain 16 also have shallow extension regions 25, 26, respectively. The presence of shallow extension regions 25, 26 near the ends of the channel 17 helps to reduce short channel effects, thereby improving the performance of the device.

The performance of a MOSFET device may be further improved by providing 'halo' regions 27, 28 between the substrate 12 and shallow source and drain extensions 25, 26.

The halo regions 27, 28 are formed by implantation of the substrate with a dopant of opposite conductivity type to that used to form the source and drain extensions 25, 26. By way of example, in an n-type FET (nFET) formed on a silicon substrate, the source and drain extensions may be made by implanting a silicon substrate with an n-type dopant such as arsenic or phosphorous. Halo regions in this device would be formed by implanting the substrate with a p-type dopant such as boron.

The purpose of forming the halo regions 27, 28 is to suppress 'punchthrough', one of several short channel effects that degrade the performance of the device. Punchthrough occurs when the channel length of the device is sufficiently short to allow the depletion regions at the ends of the source and drain extensions to overlap, leading to a breakdown condition. Although punchthrough is generally avoided by appropriate circuit design, the presence of the halo regions 27, 28 shortens the depletion regions at the ends of the source and drain extensions 25, 26. This allows the fabrication of devices having shorter channel regions whilst still avoiding breakdown by punchthrough.

A recent advance in the development of higher performance MOSFET devices has been the inclusion of strained silicon regions in the device. It has been found that the drive current of an nFET may be enhanced by applying a tensile stress along the length of the channel 17. The performance of a p-type FET (pFET) may be enhanced by applying a compressive stress along the length of the channel 17 instead of a tensile stress.

However, if a compressive stress is applied along the length of the channel 17 of an nFET the performance of the nFET is degraded. Similarly, if a tensile stress is applied along the length of the channel 17 of a pFET, the performance of the pFET is degraded.

A number of methodologies have been developed for introducing a strain along the length of the channel 17. These include the growth of an epitaxial layer (hereinafter referred to as an epilayer) of a semiconductor material having a first natural lattice constant on top of a substrate 12 having a second natural lattice constant different from the first. A biaxially strained epitaxial layer of the overlying semiconductor material may thereby be formed. By natural lattice constant is meant the lattice constant of the bulk, unstrained crystalline material.

For example, the epitaxial layer may be formed from silicon, and the substrate may be formed from a silicon germanium alloy (hereinafter referred to as silicon germanium). Silicon has a natural lattice constant of approximately 5.43 Å. Silicon germanium has a natural lattice constant of between 5.43 Å and 5.66 Å, depending upon the concentration of germanium in the alloy. The higher the concentration of germanium, the larger the natural lattice constant of the alloy. Since the natural lattice constant of silicon germanium is higher than that of silicon, the entire silicon epilayer will be in a state of biaxial tensile stress. U.S. Pat. No. 6,867,428 (BESSER et al.) discloses a strained silicon nFET having a strained silicon channel formed in such an epilayer.

An alternative approach to the formation of a strained channel region is to use an unstrained silicon substrate and introduce strain into the channel by forming stressor regions within each of the source and drain regions of the device. A stressor region is formed from an epitaxial material having a lattice constant different to that of the substrate. If the natural lattice constant of the stressor material is larger than that of the substrate, the stressor regions will exert a compressive stress on the channel. In the case of a silicon substrate, the inclusion of epitaxial silicon-germanium stressor regions will create a compressive stress in the channel.

Silicon-carbon alloy (hereinafter referred to as silicon carbon) has a smaller natural lattice constant than silicon, and may also be grown epitaxially on silicon. The inclusion of an epitaxial silicon carbon stressor region within the source and drain regions produces a tensile stress along the length of the channel.

In certain advanced device structures it is desirable to have the stressor regions as close to the channel as possible in order to further optimise the stress applied to the channel. Thus, stressor regions may be formed within the source and drain extension regions. The extension regions may undercut spacers formed on sidewalls of the gate stack. However this has proved difficult to achieve in practice.

The source and drain stressors may be formed by implantation of the substrate. For example, germanium may be implanted into a silicon substrate to form a silicon germanium alloy. Alternatively, source and drain recesses may be formed in the silicon substrate, and an epitaxial stressor material such as silicon germanium deposited in the recesses.

In several known transistor structures having source/drain extension stressors the channel region is not defined by ends of the source/drain extension stressors. Rather, the source/drain extension stressors lie within a boundary of the source/drain extension region, such that a region of doped silicon is provided between the stressor region and respective ends of the source/drain extension regions.

Methods of forming the source and drain extension stressors by etching of the substrate may be adapted to form source and drain stressor extension recesses by exploiting a feature of isotropic etching processes known as 'undercut'. If the source and drain recesses are formed by an isotropic etching technique, removal of portions of the substrate underlying spacer elements 21, 22 will occur. This phenomenon is known as 'undercut'.

A disadvantage of isotropic etching processes, however, is that they are difficult to control. Isotropic etching processes may be affected by the presence of residual film on the surface of the device. In addition they may be affected by microloading effects arising from nearby protective layers. It is therefore difficult to ensure that source and drain stressor extension recesses formed by isotropic etching are of a reproducible morphology. By protective layers are meant layers that are used to protect areas of the substrate that are not to be etched to form a recess.

A further disadvantage of the prior art is that a large number of process steps are required in order to fabricate a semiconductor device. For example, multiple steps of depositing mask layers, patterning mask layers, etching layers, cleaning surfaces prior to deposition, and subsequent steps of deposition. These steps may be repeated several times in the course of fabricating a device.

Solutions to these problems have been long sought but prior developments have not taught or suggested any solutions and, thus, solutions to these problems have long eluded those skilled in the art.

SUMMARY OF THE INVENTION

It is an object of the present invention to at least partly mitigate the above-mentioned problems.

It is a further object of embodiments of the invention to provide an improved transistor structure with a strained channel region.

Another object of embodiments of the present invention is to provide a fabrication method for a strained channel transistor structure.

According to a first aspect of the present invention there is provided a method of forming a strained channel transistor structure on a substrate, comprising the steps of: forming a source stressor recess comprising a deep source recess and a source extension recess; forming a drain stressor recess comprising a deep drain recess and a drain extension recess; and subsequently forming a source stressor in said source recess and a drain stressor in said drain recess. Embodiments of the present invention provide a number of advantages over the prior art. In some embodiments of the present invention, the stressors are formed in the entire source/drain and source/drain extension regions. Thus, the width of the channel region is defined by adjacent ends of the extension stressor regions. This has the advantage that a level of strain in the channel may be made higher than in prior art devices where stressors are formed only in portions of the source/drain and source/drain extension regions. In other embodiments, the width of the channel region is not exactly defined by adjacent ends of the extension stressor regions, due to a blurring effect at the interface between the stressor and substrate caused by diffusion of dopants from the extension stressor regions toward the channel during a subsequent spike anneal step. Nevertheless, extension stressor regions are extremely close to the channel region.

In embodiments of the invention, the source/drain and source/drain extension stressors are formed by means of an etch process, which has the advantage that a boundary between the source/drain and source/drain extension stressors may be made highly abrupt. Highly abrupt junctions may therefore be formed between the source/drain extension stressors and the strained channel region. This feature enables improved short channel behaviour to be attained.

Furthermore, in embodiments of the invention the source/drain stressors are formed by an uninterrupted etch process and an uninterrupted epitaxy process. An advantage of using an uninterrupted process is that the fabrication process may be performed in a shorter time period and with a reduced number of process steps. Both of these factors may have substantial implications for increased process efficiency and device yield, and reduced manufacturing costs. The uninterrupted etch and uninterrupted epitaxy process disclosed by embodiments of the invention enables a source/drain recess to be formed having an extension recess that has a depth less than that of the rest of the recess. This has the advantage of improving the stress distribution in the transistor structure.

During the process of growing source/drain and source/drain extension stressors according to embodiments of the invention, the source/drain and source/drain extension stressors may be doped in-situ. An advantage of this feature is that the source and drain extension regions may be made highly activated. If the source/drain and source/drain extension stressors are not doped in-situ, conventional ion implantation and annealing can be performed to form doped source/drain and source/drain extension stressors.

BRIEF DESCRIPTION OF THE DRAWINGS

Embodiments of the present invention will now be described hereinafter, by way of example only, with reference to the accompanying drawings, in which.

DETAILED DESCRIPTION OF THE INVENTION

The following embodiments are intended to illustrate the invention more fully without limiting their scope, since numerous modifications and variations will be apparent to those skilled in the art.

FIGS. 2A to 2D illustrate structures formed during fabrication of a strained channel transistor structure 200 (FIG. 2D) in accordance with a first preferred embodiment of the present invention.

Shallow trench isolation (STI) regions 205 are formed in the substrate 202 between transistor structures 200. The STI regions 205 may be formed by forming trenches having tapered sidewalls in the substrate 202, and filling the trenches with a material such as silicon oxide, silicon nitride, or others.

Figure 1:
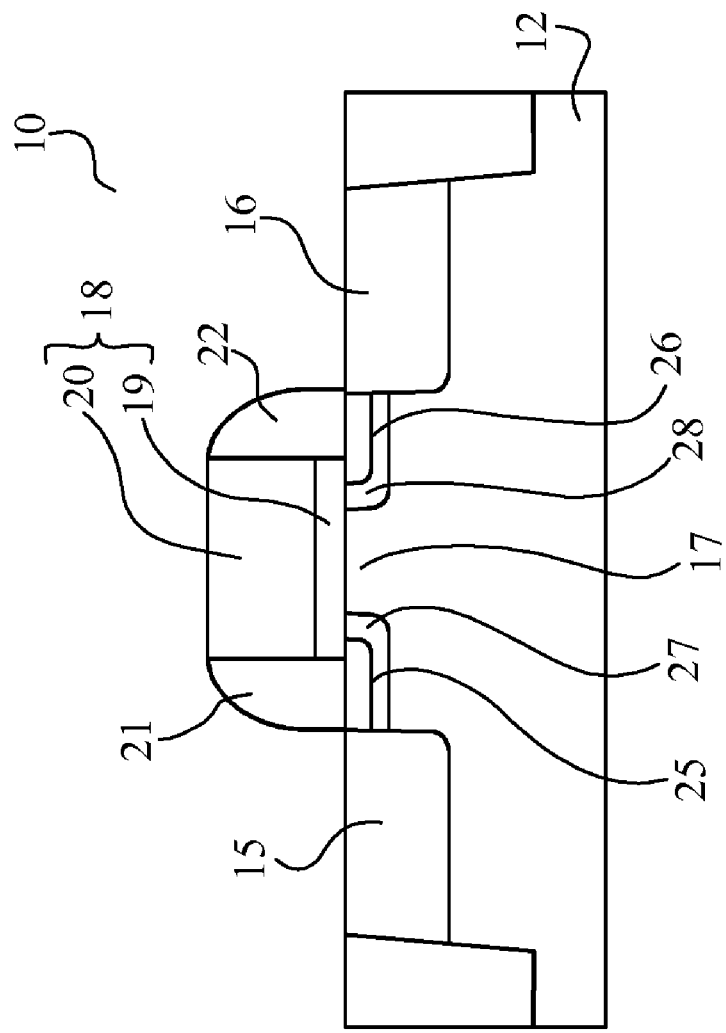
FIG. 1 (PRIOR ART) is a cross-section illustrating a prior art MOSFET device.
Figure 2A:
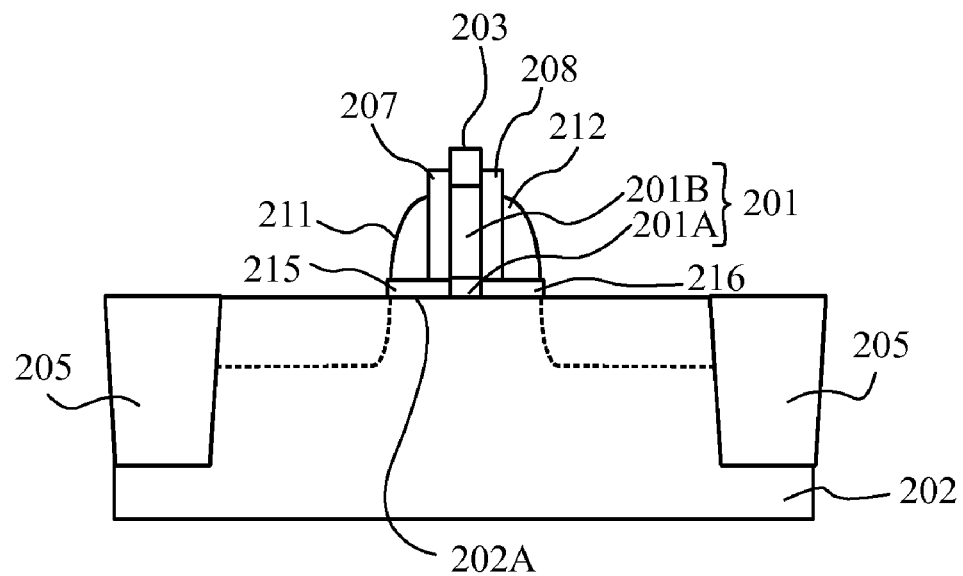
FIGS. 2A, 2B, 2C and 2D show structures formed during a process of fabrication of a MOSFET in accordance with an embodiment of the invention.

FIG. 2A shows a device structure having a gate structure 201 formed on a substrate 202 of a first semiconductor material which is silicon. Whilst the first semiconductor material is described here as silicon it will be understood that other materials such as germanium or GaAs or others could be used. The gate structure 201 has a gate insulating layer 201A formed on the silicon substrate 202 and a gate electrode 201B formed above the gate insulator layer 201A.

The gate insulator layer 201A is silicon oxide but it will be appreciated that other materials could be used such as silicon nitride, aluminium oxide, hafnium oxide or others alone or in combination, for example a combination of layers of silicon oxide and silicon nitride. Silicon oxide may be grown by thermal oxidation of the silicon substrate. Nitrogen can be introduced into the silicon oxide by means of plasma nitridation or thermal nitridation.

The gate electrode 201B is typically polysilicon, but may alternatively be germanium, nickel silicide, copper, aluminium or others such as polysilicon implanted with a second material such as germanium.

A hardmask layer 203 is formed above the gate structure 201. The hardmask layer 203 is advantageously an oxide hardmask layer and the thickness of the hardmask layer 203 is from about 50 Angstroms to about 600 Angstroms.

Conventional spacer elements are formed on sidewalls of the gate structure 201. The spacer elements comprise offset spacer elements 207, 208 on a source side and a drain side of the gate structure, respectively, and disposable nitride spacer elements 211, 212 formed on sidewalls of the offset spacer elements 207, 208 respectively. An optional implant into the source and drain regions may be performed to enhance the etch rate in the source and drain regions during subsequent etch.

The offset spacer elements are advantageously formed from silicon oxide, whilst the disposable nitride spacer elements are advantageously formed from silicon nitride. Disposable oxide spacer elements 215, 216 are also formed above the substrate 202 on a gate side and a drain side of the gate structure 201, respectively. The disposable oxide spacer elements 215, 216 are sandwiched between the substrate 202 and the disposable nitride spacer elements 211, 212, respectively. In embodiments of the invention the disposable oxide spacer elements 215, 216 may be formed from the same oxide film as the offset spacer elements 207, 208. Advantageously the thickness of the disposable oxide spacer elements 215, 216 is from about 20 Angstroms to about 300 Angstroms.

Figure 2B:
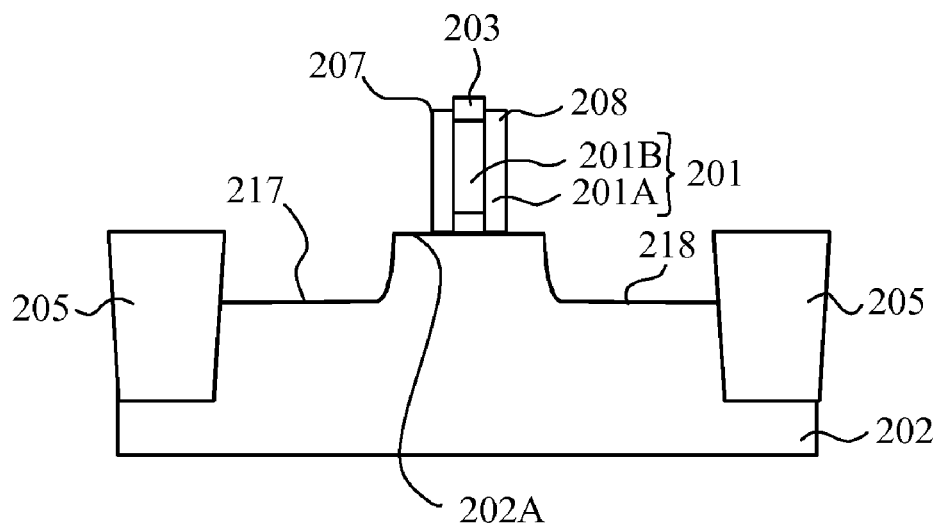

FIG. 2B shows the structure of FIG. 2A following the removal of the disposable nitride spacer elements 211, 212 and the formation of a first portion of a deep source stressor recess 217 and a first portion of a deep drain stressor recess 218. Advantageously, the first portions of the deep stressor recesses are about 300 Angstroms to about 1200 Angstroms in depth.

The disposable nitride spacer elements 211, 212 may be removed by a step of etching. The step of etching may include a step of wet etching. Alternatively, the step of etching may include a step of chemical downstream etching (CDE). The step of etching the disposable nitride spacer elements exposes the offset spacer elements 207, 208 and the disposable oxide spacer elements 215, 216. 'L'-shaped spacer elements are formed by an exposed drain side offset spacer element 208 together with an exposed source side disposable oxide spacer element 216, and an exposed source side offset spacer element 207 together with an exposed drain side disposable oxide spacer element 215.

According to the first embodiment of the invention, the disposable oxide spacer elements 215, 216 are consumed during the formation of the first portions of the deep stressor recesses 217, 218. Advantageously, parameters of the fabrication process, such as a thickness of the disposable oxide spacer elements 215, 216, the etching conditions, and other parameters are adjusted such that exposed portions of the disposable oxide spacer elements 215, 216 are entirely consumed at around the same time as formation of the first portions of the stressor recesses 217, 218 is complete. Advantageously, an etch having a low selectivity between the substrate material and the disposable oxide spacer elements 215, 216 is used.

Reactive ion etching of the source and drain stressor recesses is advantageously performed using a gaseous etchant comprising a mixture of flowing gases. The mixture of flowing gases may comprise: HBr, O2, He, Cl2, SF6, N2 (either individually or in combination) at a flow rate of from about 5 to about 300 sccm; at a temperature between about 30 and 100 C. The pressure may be from about 5 to about 100 mTorr at a power from about 20 to about 500 W and for a duration of about 7 to about 200 seconds.

Upper portions of the offset spacer elements 207, 208 and an upper portion of the hardmask layer 203 may also be etched during the formation of the first portions of the deep stressor recesses 217, 218. Thus, the offset spacer elements 207, 208 and hardmask layer 203 are formed to have dimensions sufficient to ensure that following the etch process the gate stack 201 is still protected.

Advantageously, the first portions of the deep stressor recesses 217, 218 are formed by the steps of isotropic reactive ion etching. Isotropic reactive ion etching has the advantage that it forms a rounded recess with the flexibility to tune the recess profile. This allows more strain to be imparted to the device channel provided it does not degrade the short channel characteristics. Alternatively, a combination of anisotropic and isotropic etch processes can be used.

Figure 2C:
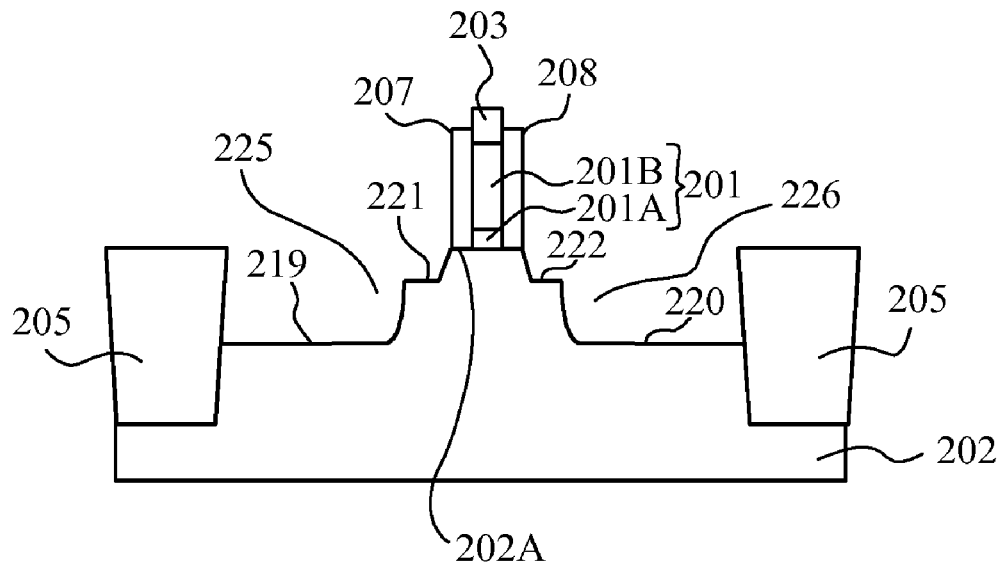

FIG. 2C shows the structure of FIG. 2B following the further steps of etching of exposed areas of the substrate 202. The further steps of etching result in the formation of a second portion of a deep source stressor recess 219 and a source extension recess 221; and a second portion of a deep drain stressor recess 220 and a drain extension recess 222.

Advantageously, the second portion of the deep source recess is formed to have a depth from about 200 to about 600

Angstroms. The depth of the source extension recess is advantageously from about 100 to about 500 Angstroms.

Advantageously, the stressor extension recesses 221, 222 and the second portions of the deep stressor recesses 219, 220 are formed by an anisotropic etching process.

In alternative embodiments the first portions of the deep stressor recesses are also formed by an anisotropic etching process. In that case, the same etching conditions may be used to form the first and second portions of the deep stressors.

In further alternative embodiments, each of the recesses are etched using an isotropic etching process.

Since areas of the substrate in which the deep stressor recesses are formed are exposed to etching conditions for a longer period of time than areas of the substrate in which the stressor extension recesses are formed, the deep stressor recesses are of a depth greater than that of the stressor extension regions. This results in the formation of a stepped recess source recess 225 and a stepped drain recess 226. The source recess 225 has a deep source recess 219 and a source extension recess 221. The drain recess 226 has a deep drain recess 220 and a drain extension recess 222.

Figure 2D:
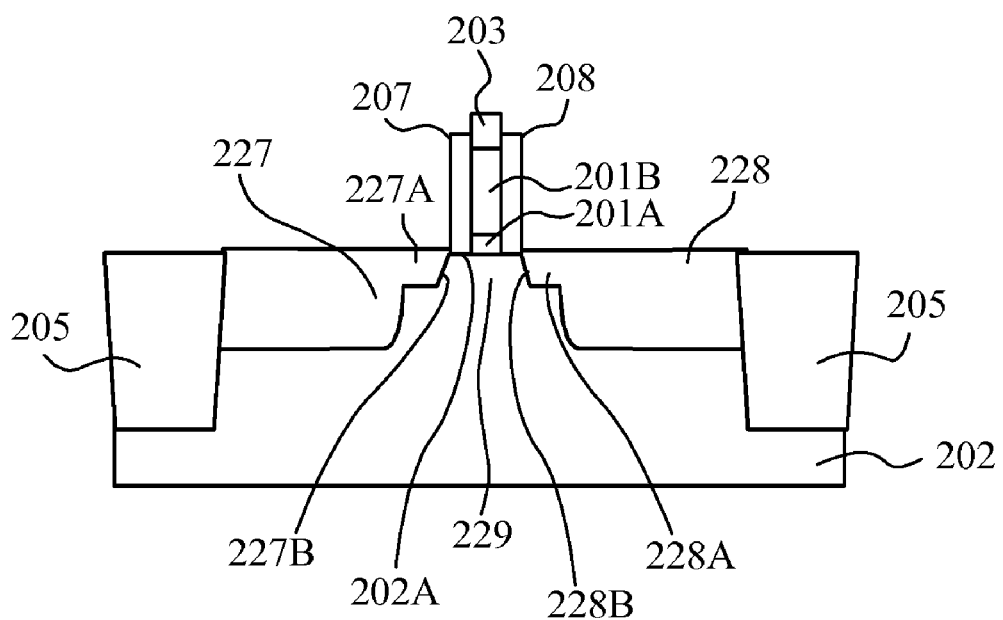

FIG. 2D shows the structure of FIG. 2C following the steps of selective epitaxial growth of a second semiconductor material in the stressor recesses 225, 226. The steps of selective epitaxial growth of the second semiconductor material result in the formation of a source stressor 227 having a source extension stressor region 227A, and a drain stressor 228 having a drain extension stressor region 228A.

Advantageously the selective growth of the second semiconductor material is performed such that growth of second semiconductor material occurs only over exposed surfaces of the substrate 202. The topography of the upper surface can be controlled by use of a high temperature epitaxial growth and/or switching of gas flows during epitaxial growth, as will be understood by those skilled in the art.

Furthermore, it is advantageous that the second semiconductor material is doped in-situ with a dopant. An advantage of in-situ doping is that a separate dopant implantation step is not required. Furthermore, the uniformity of dopant concentration within the stressor may be more closely controlled than in the case of implantation of dopant. More highly activated source and drain regions may also be formed by the step of in-situ doping.

The composition of the stressors, including a concentration of dopant in the stressors, may be uniform throughout each stressor. Alternatively, the composition of the second semiconductor material may be varied within each stressor. In a further alternative, the composition of dopant within each stressor may be varied. For example, a concentration of dopant in an upper portion of each stressor may be different from a composition of dopant in a lower portion of each stressor.

An epitaxy preclean of the exposed surfaces of the substrate is performed prior to selective epitaxial growth so that growth of high quality epitaxial material may take place. The epitaxy preclean is advantageously performed using hydrogen fluoride (HF), either in a gaseous or liquid solution form, or by a combination of steps and chemicals that include HF in a gaseous or liquid form. Prior to selective epitaxial growth, a pre-bake step may also be performed to ensure good quality epitaxial layers are formed. The pre-bake step may include the steps of heating to a temperature in the range from about 750° C. to about 1000° C. for a duration in the range of about 2 seconds to about 20 minutes.

The ambient atmosphere during the pre-bake step may include a hydrogen ($H_2$) atmosphere. Alternatively a nitrogen ($N_2$) atmosphere, an argon atmosphere, or another atmosphere may be used, such as a combination of both a hydrogen atmosphere and a nitrogen atmosphere. Advantageously the pre-bake step includes a hydrogen atmosphere. Advantageously the epitaxial growth is performed by chemical vapor deposition or molecular beam epitaxy. More advantageously the epitaxial growth is performed by rapid thermal chemical vapor deposition (RTCVD).

In the case of the formation of pFET devices, the second semiconductor material advantageously contains a silicon-germanium alloy (hereinafter referred to as silicon germanium). Advantageously, the Ge composition in the silicon germanium is 10 to 40 atomic percent. The Ge atoms are advantageously positioned in the substitutional lattice sites in order to produce a strained channel.

In the case of the formation of nFET devices, the second semiconductor material advantageously contains a silicon-carbon alloy (hereinafter referred to as silicon carbon). Advantageously, the C composition in the silicon carbon is 0.1 to 10 atomic percent. The C atoms are advantageously positioned in the substitutional lattice sites in order to produce a strained channel.

A conduction channel 229 (hereinafter referred to as a 'channel' 229) is defined in the substrate 202 by opposed ends 227B, 228B of the extension stressor regions 227A, 228A. The channel 229 is subject to strain due to the presence of the stressors 227, 228 and is therefore also referred to as a 'strained channel' 229. Alternatively, the width of the channel 229 may be defined by adjacent ends of the extension stressor regions 227A, 228A, together with a blurring effect due to diffusion of dopants from the extension stressor regions 227A, 228A toward the channel 229 during a subsequent spike anneal step.

The source stressor and the drain stressor may be formed such that their upper surfaces are substantially coplanar with a surface 202A of the substrate 202. Alternatively, the source stressor and the drain stressor may protrude beyond a level of the surface 202A of the substrate 202, thus resulting in a raised source and drain structure. Raised source and drain structures have the advantage that device performance is enhanced.

Formation of stressor regions by etching, followed by deposition of stressor material in a recess formed by etching, is advantageous over stressor formation by implantation (e.g., implantation of Ge into a silicon substrate). Stressor regions may be formed with superior uniformity when formed by the steps of etching and deposition as opposed to implantation, due to the need for careful control of implantation energies in the case of stressor formation by implantation. It will of course be appreciated that embodiments of the present invention form part of the stressor region by implantation.

Embodiments of the present invention have been hereinbefore described with reference to the use of hard mask layers. It will be understood that other types of masking layers such as soft mask layers or others could be used.

FIGS. 3A to 3E illustrate structures formed during fabrication of a strained channel transistor structure 300 (FIG. 3E) in accordance with a second preferred embodiment of the present invention.

Shallow trench isolation (STI) regions 305 are formed in the substrate 302 between transistor structures 300. The STI regions 305 may be formed by forming trenches having tapered sidewalls in the substrate 302, and filling the trenches with an oxide such as silicon oxide.

Figure 3A:
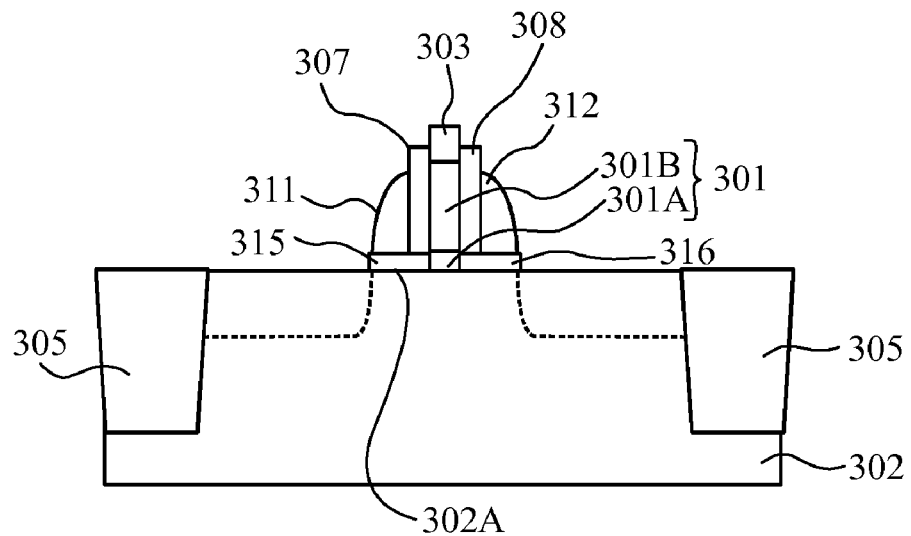
FIGS. 3A, 3B, 3C, 3D and 3E show structures formed during a process of fabrication of a MOSFET in accordance with another embodiment of the invention.

FIG. 3A shows a device structure having a gate structure 301 formed on a substrate 302 of a first semiconductor material which is silicon. Whilst the first semiconductor material is described here as silicon it will be understood that other materials such as germanium or GaAs or others could be used. The gate structure 301 has a gate insulating layer 301A formed on the silicon substrate 302 and a gate electrode 301B formed above the gate insulator layer 301A.

The gate insulator layer 301A is silicon oxide but it will be appreciated that other materials could be used such as silicon nitride, aluminium oxide, hafnium oxide or others alone or in combination, for example a combination of layers of silicon oxide and silicon nitride. Silicon oxide may be grown by thermal oxidation of the silicon substrate. Nitrogen can be introduced into the silicon oxide by means of plasma nitridation or thermal nitridation.

The gate electrode 301B is typically polysilicon, but may alternatively be germanium, nickel silicide, copper, aluminium or others such as polysilicon implanted with a second material such as germanium.

A hardmask layer 303 is formed above the gate structure 301. Advantageously, the hardmask layer 303 is an oxide hardmask layer and the thickness of the hardmask layer 303 is from about 50 Angstroms to about 600 Angstroms.

Conventional spacer element elements are formed on sidewalls of the gate structure 301. The spacer elements comprise offset spacer elements 307, 308 on a source side and a drain side of the gate structure, respectively, and disposable nitride spacer elements 311, 312 formed on sidewalls of the offset spacer elements 307, 308 respectively.

The offset spacer elements are advantageously formed from silicon oxide, whilst the disposable nitride spacer elements are advantageously formed from silicon nitride. Disposable oxide spacer elements 315, 316 are formed above the substrate 302 on a gate side and a drain side of the gate structure 301, respectively. The disposable oxide spacer elements 315, 316 are sandwiched between the substrate 302 and the disposable nitride spacer elements 311, 312, respectively. In embodiments of the invention the disposable oxide spacer elements 315, 316 may be formed from the same oxide film as the offset spacer elements 307, 308.

Figure 3B:
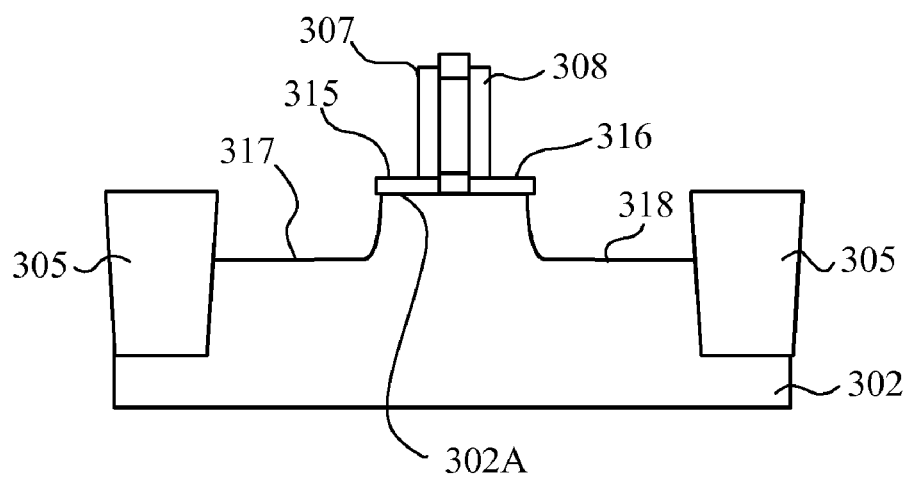

FIG. 3B shows the structure of FIG. 3A following the step of removing the disposable nitride spacer elements 311, 312 and etching exposed areas of the substrate 302 to form a first portion of a deep source stressor recess 317 and a first portion of a deep drain stressor recess 318. Advantageously, the first portion of the deep stressor recesses 317, 318 is about 300 A to about 1200 A deep.

Advantageously, the first portions of the deep stressor recesses 317, 318 are formed by the steps of isotropic reactive ion etching. Isotropic reactive ion etching has the advantage that it forms a rounded recess with the flexibility to tune the recess profile. This allows more strain to be imparted to the device channel. Alternatively, a combination of anisotropic and isotropic etch processes can be used.

The disposable nitride spacer elements 311, 312 may be removed by a step of etching. The step of etching may include a step of wet etching. Alternatively, the step of etching may include a step of chemical downstream etching (CDE). The step of etching the disposable nitride spacer elements exposes the offset spacer elements 307, 308 and the disposable oxide spacer elements 315, 316.

'L'-shaped spacer elements are formed by an exposed drain side offset spacer element 308 together with an exposed source side disposable oxide spacer element 316, and an exposed source side offset spacer element 307 together with an exposed drain side disposable oxide spacer element 315.

Advantageously, the first portions of the deep stressor recesses 317, 318 are formed by a process of reactive ion etching.

According to the second embodiment of the invention, the disposable oxide spacer elements 315, 316 remain following formation of the first portions of the deep stressor recesses 317, 318. This is achieved by performing a selective reactive ion etching process. The selective reactive ion etching process is directed to etch silicon and not silicon oxide.

Figure 3C:
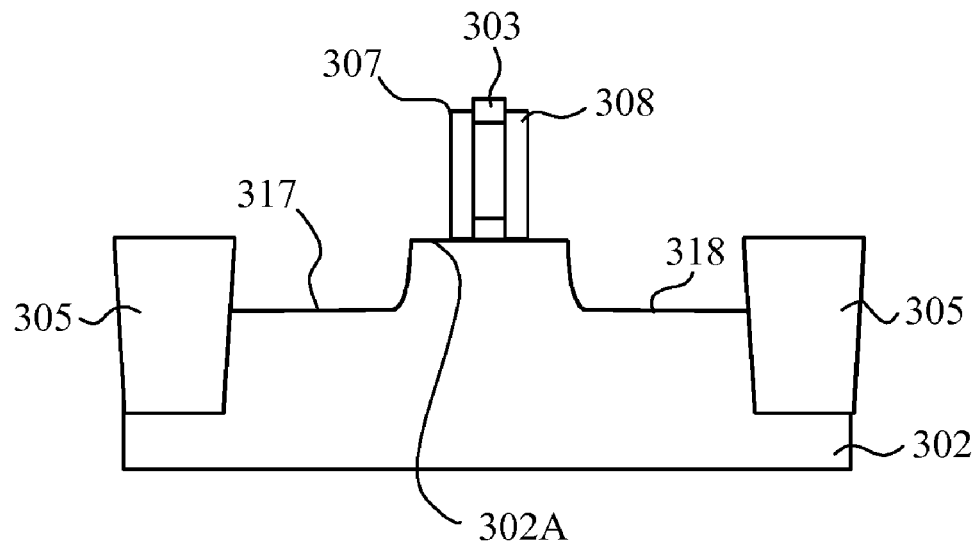

FIG. 3C shows the structure of FIG. 3B following the steps of removing the disposable oxide spacer elements 315, 316. The disposable oxide spacer elements 315, 316 may also be referred to as sacrificial spacer elements 315, 316.

Advantageously the disposable oxide spacer elements 315, 316 are removed by a process of reactive ion etching. Advantageously, the disposable oxide spacer elements 315, 316 are removed by changing a chemical composition of a gas from a first chemical composition, used in the reactive ion etching process used to form the first portions of the deep stressor recesses 317, 318, to a second chemical composition. Advantageously the chemical composition of the gas is changed from the first chemical composition to the second chemical composition when the formation of the first portions of the deep stressor recesses 317, 318 is substantially complete.

Advantageously, the first chemical composition has a flowing gas of HBr, O2, He, Cl2, SF6, or N2, either individually or in combination. The gases may be passed at a flow rate of about 5 to about 300 sccm; at a temperature of about 30 to about 100 C; at a pressure of between 5 to about 100 mTorr; at a power of about 20 to about 500 W; for a duration of about 7 to about 200 sec.

Advantageously the second chemical composition has a flowing gas of CF4, CHF3, CH2F2, or He, either individually or in combination. The gases may be passed at a flow rate of about 5 to about 300 sccm; at a temperature of about 30 to about 100 C; at a pressure of between 5 to about 100 mTorr; at a power of about 20 to about 500 W; for a duration of about 7 to about 200 sec.

Figure 3D:
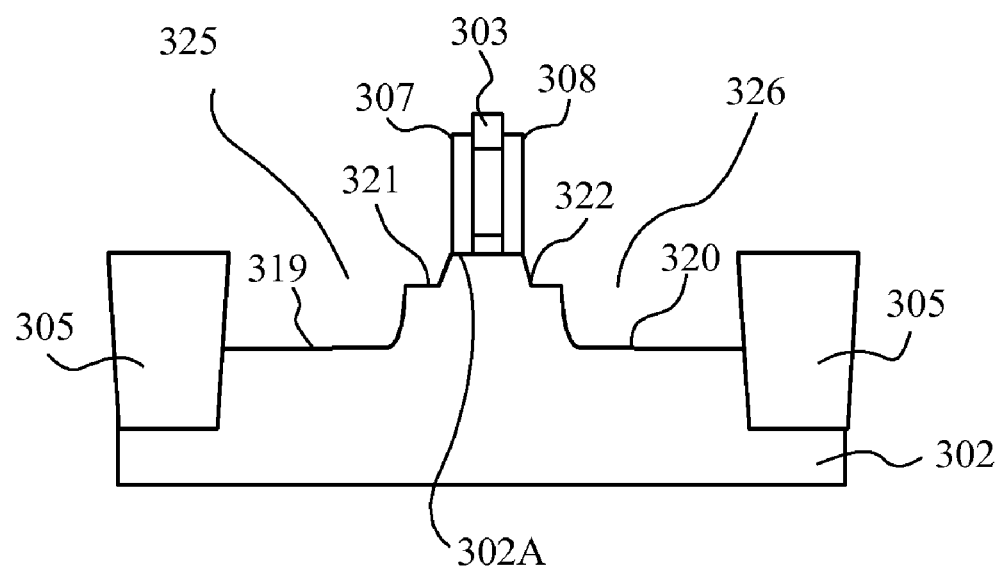

FIG. 3D shows the structure of FIG. 3C following the further steps of etching of exposed areas of the substrate 302. The further steps of etching result in the formation of a second portion of a deep source stressor recess 319 and a source extension recess 321; and a second portion of a deep drain stressor recess 320 and a drain extension recess 322

Advantageously, the further steps of etching are performed using a process of reactive ion etching using a gas of the first chemical composition.

Since areas of the substrate in which the deep stressor recesses 319, 320 are formed are exposed to etching conditions for a longer period of time than areas of the substrate in which the stressor extension recesses 321, 322 are formed, the deep stressor recesses 319, 320 are of a depth greater than that of the stressor extension regions 321, 322. This results in the formation of a stepped source recess 325 and a stepped drain recess 326. The source recess 325 has a deep source recess 319 and a source extension recess 321. The drain recess 326 has a deep drain recess 320 and a drain extension recess 322.

Advantageously, the second portion of the deep source recess is formed to have a depth from about 200 to about 600 Angstroms. The depth of the source extension recess is advantageously from about 100 to about 500 Angstroms.

Advantageously, the stressor extension recesses 321, 322 and the second portions of the deep stressor recesses 319, 320 are formed by an anisotropic etching process.

In alternative embodiments the first portions of the deep stressor recesses are also formed by an anisotropic etching process. In that case, the same etching conditions may be used to form the first and second portions of the deep stressors.

In further alternative embodiments, each of the recesses are etched using an isotropic etching process.

Figure 3E:
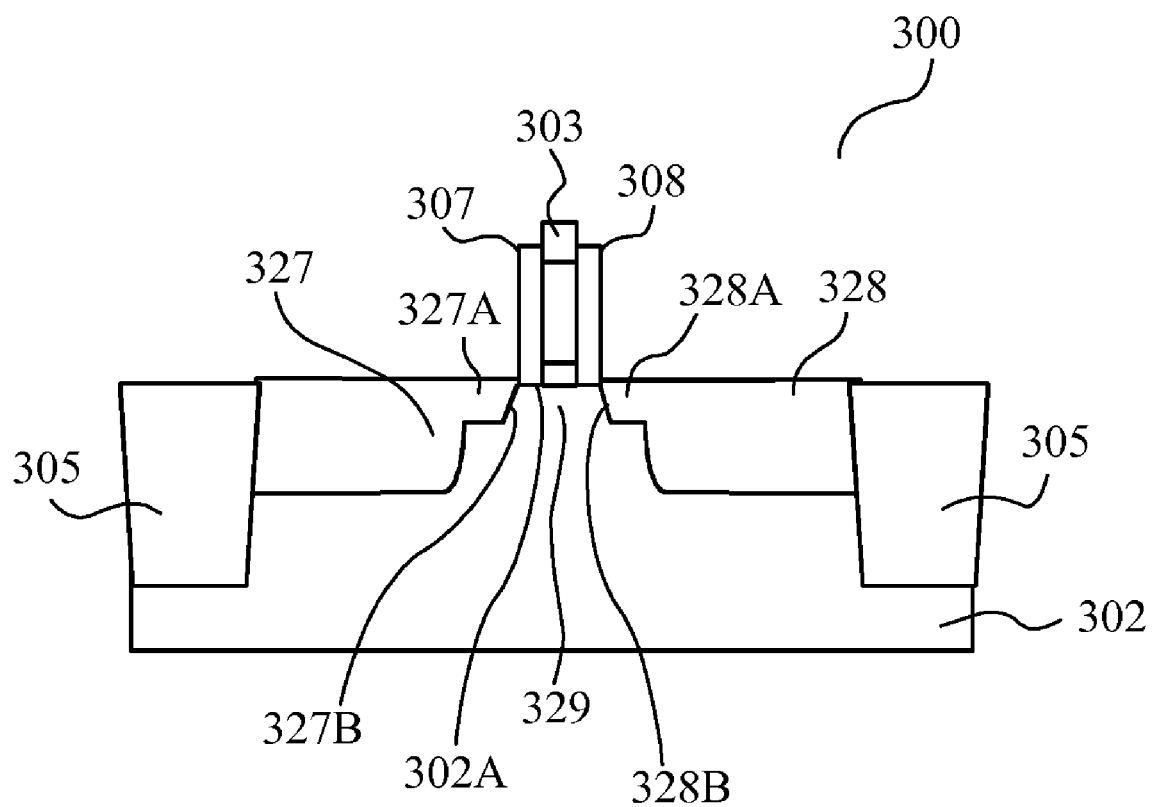

FIG. 3E shows the structure of FIG. 3D following the steps of selective epitaxial growth of a second semiconductor material in the stressor recesses 325, 326. The steps of selective epitaxial growth of the second semiconductor material result in the formation of a source stressor 327 having a source extension stressor region 327A, and a drain stressor 328 having a drain extension stressor region 328A.

As in the case of the first embodiment, advantageously the selective growth of the second semiconductor material is performed such that growth of second semiconductor material occurs only over exposed surfaces of substrate 202. The topography of the upper surface can be controlled by use of a high temperature epitaxial growth and/or switching of gas flows during epitaxial growth, as will be understood by those skilled in the art.

Furthermore, it is also advantageous that the second semiconductor material is doped in-situ with a dopant. An advantage of in-situ doping is that a separate dopant implantation step is not required. Furthermore, the uniformity of dopant concentration within the stressor may be more closely controlled than in the case of implantation of dopant. More highly activated source and drain regions may also be formed by the step of in-situ doping.

The composition of the stressors, including a concentration of dopant in the stressors, may be uniform throughout each stressor. Alternatively, the composition of the second semiconductor material may be varied within each stressor. In a further alternative, the composition of dopant within each stressor may be varied. For example, a concentration of dopant in an upper portion of each stressor may be different from a composition of dopant in a lower portion of each stressor.

An epitaxy preclean of the exposed surfaces of the substrate is performed prior to selective epitaxial growth so that growth of high quality epitaxial material may take place. The epitaxy preclean is advantageously performed using hydrogen fluoride (HF), either in a gaseous or liquid solution form, or by a combination of steps and chemicals that include HF in a gaseous or liquid form. Prior to selective epitaxial growth, a pre-bake step may also be performed to ensure good quality epitaxial layers are formed. The pre-bake step may include the steps of heating to a temperature in the range from about 750° C. to about 1000° C. for a duration in the range of about 2 seconds to about 20 minutes.

The ambient atmosphere during the pre-bake step may include a hydrogen ($H_2$) atmosphere. Alternatively a nitrogen ($N_2$) atmosphere, an argon atmosphere, or another atmosphere may be used, such as a combination of both a hydrogen atmosphere and a nitrogen atmosphere. Advantageously the pre-bake step includes a hydrogen atmosphere. Advantageously the epitaxial growth is performed by chemical vapor deposition or molecular beam epitaxy. More advantageously the epitaxial growth is performed by rapid thermal chemical vapor deposition (RTCVD).

A conduction channel 329 (hereinafter referred to as a 'channel' 329) is defined in the substrate 302 by opposed ends 327B, 328B of the extension stressors 327A, 328A. The channel 329 is subject to strain due to the presence of the stressors 327, 328, and is therefore also referred to as a 'strained channel'. Alternatively, the width of the channel 329 may be defined by adjacent ends of the extension stressor regions 327A, 328A, together with a blurring effect due to diffusion of dopants from the extension stressor regions 327A, 328A toward the channel 329 during a subsequent spike anneal step.

The source stressor 327 and the drain stressor 328 may be formed such that their upper surfaces are substantially coplanar with a surface 302A of the substrate 302. Alternatively, the source stressor and the drain stressor may protrude beyond a level of the surface 302A of the substrate 302, thus resulting in a raised source and drain structure. Raised source and drain structures have the advantage that device performance is enhanced.

Formation of stressor regions by etching, followed by deposition of stressor material in a recess formed by etching, is advantageous over stressor formation by implantation (e.g., implantation of Ge into a silicon substrate). Stressor regions may be formed with superior uniformity when formed by the steps of etching and deposition as opposed to implantation, due to the need for careful control of implantation energies in the case of stressor formation by implantation. It will of course be appreciated that embodiments of the present invention form part of the stressor region by implantation.

Embodiments of the present invention have been hereinbefore described with reference to the use of hard mask layers. It will be understood that other types of masking layers such as soft mask layers or others could be used.

Throughout the description and claims of this specification, the words "comprise" and "contain" and variations of the words, for example "comprising" and "comprises", means "including but not limited to", and is not intended to (and does not) exclude other moieties, additives, components, integers or steps.

Throughout the description and claims of this specification, the singular encompasses the plural unless the context otherwise requires. In particular, where the indefinite article is used, the specification is to be understood as contemplating plurality as well as singularity, unless the context requires otherwise.

Features, integers, characteristics, compounds, chemical moieties or groups described in conjunction with a particular aspect, embodiment or example of the invention are to be understood to be applicable to any other aspect, embodiment or example described herein unless incompatible therewith.

The invention claimed is:

1. A method of forming a strained channel transistor structure on a substrate, comprising the steps of:
   forming a source stressor recess comprising a deep source recess and a source extension recess;
   forming a drain stressor recess comprising a deep drain recess and a drain extension recess; and
   subsequently forming a source stressor in said source stressor recess and a drain stressor in said drain stressor recess whereby the step of forming source and drain stressor recesses is preceded by a step of forming a sacrificial layer above portions of the substrate where respective source and drain extension stressor recesses are to be formed and whereby the step of forming each of the source and drain stressor recesses further comprises the steps of:
   forming a first portion of the deep stressor recess;
   removing said sacrificial layer;
   subsequently forming a second portion of the deep stressor recess; and
   forming the extension stressor recess.

2. The method as claimed in claim 1 whereby the source stressor comprises a deep source stressor portion and a source extension stressor portion, and the drain stressor comprises a deep drain stressor portion and a drain extension stressor portion.

3. The method as claimed in claim 2 further comprising forming deep source and deep drain stressor portions having a depth greater than a depth of corresponding source and drain extension stressor portions.

4. The method as claimed in claim 3 further comprising forming a strained channel between opposed ends of the source and drain extension stressor portions.

5. The method as claimed in claim 2 wherein upper surfaces of the extension stressor portions are substantially coplanar with the surface of the substrate.

6. The method as claimed in claim 1 whereby the step of removing said sacrificial layer is performed contemporaneously with a step of etching the first portion of the deep stressor recess, said etching step thereby removing the sacrificial layer.

7. The method as claimed in claim 6 wherein the step of etching said first portion of the deep stressor recess comprises a step of isotropic etching said stressor recess.

8. The method as claimed in claim 7 wherein said step of isotropic etching comprises a step of reactive ion etching.

9. The method as claimed in claim 8 wherein the step of forming said second portion of the deep stressor recess and the step of forming the extension stressor recess comprises a step of anisotropic etching.

10. The method as claimed in claim 9 wherein the step of anisotropic etching comprises a step of reactive ion etching.

11. The method as claimed in claim 6 wherein the steps of forming said first portion of the deep stressor recess, forming said second portion of the deep stressor recess and forming the extension stressor recess are all performed by anisotropic etching or all performed by isotropic etching.

12. The method as claimed in claim 1, wherein the substrate is formed from a first semiconductor material having a first natural lattice constant and the step of forming said stressor comprises a step of filling said recess with a second semiconductor material having a second natural lattice constant different from the first semiconductor material.

13. The method as claimed in claim 12 wherein the step of filling said recess with second semiconductor material comprises a step of in-situ doping said second semiconductor material.

14. The method as claimed in claim 12 wherein the step of filling said recess with second semiconductor material further comprises a step of forming a raised source stressor region and a raised drain stressor region, whereby upper surfaces of the deep source and drain stressors protrude beyond a level of a surface of the substrate.

15. The method as claimed in claim 1 wherein the step of removing said sacrificial layer is performed subsequent to the step of forming the first portion of the deep stressor recess.

16. The method as claimed in claim 15 wherein the step of removing said sacrificial layer comprises a step of changing a composition of an etchant used to etch the first portion of the deep stressor recess, to thereby consume the sacrificial layer.

17. The method as claimed in claim 16 wherein the etchant is provided in the form of a gas.

18. The method as claimed in claim 17 wherein the steps of forming said first portion of the deep stressor recess, the second portion of the deep stressor recess and the stressor extension recess are all performed by anisotropic etching or all performed by isotropic etching.

19. The method as claimed in claim 15 wherein the step of forming said first portion of the deep stressor recess comprises steps of anisotropic etching.

20. The method as claimed in claim 19 wherein the steps of anisotropic etching comprise steps of reactive ion etching.

21. The method as claimed in claim 20 wherein the step of forming the second portion of the deep stressor recess and the step of forming the extension stressor recess comprise the steps of anisotropic etching.

22. The method as claimed in claim 19 wherein the steps of anisotropic etching said stressor recess comprise steps of reactive ion etching.

* * * * *